United States Patent [19]

Ross

[11] Patent Number: 5,180,970
[45] Date of Patent: Jan. 19, 1993

[54] MECHANICALLY ADJUSTABLE CURRENT SENSOR AND METHOD FOR MAKING SAME

[75] Inventor: Gordon F. Ross, Freeport, Ill.

[73] Assignee: Honeywell Inc., Minneapolis, Minn.

[21] Appl. No.: 833,286

[22] Filed: Feb. 10, 1992

[51] Int. Cl.$^5$ ............................................. G01R 33/00
[52] U.S. Cl. ............................ 324/117 H; 324/117 R; 324/251; 307/309
[58] Field of Search ............... 324/127, 117 H, 117 R, 324/225, 251; 336/212; 307/309; 338/32 H, 32 R

[56] References Cited

U.S. PATENT DOCUMENTS

| | | | |
|---|---|---|---|
| 3,194,939 | 7/1965 | Hill | 324/117 H |
| 4,059,798 | 11/1977 | Dierker et al. | 324/117 H |
| 4,682,101 | 7/1987 | Cattaneo | 324/117 H |
| 4,761,960 | 8/1988 | Higham et al. | 62/6 |

*Primary Examiner*—Vinh Nguyen
*Attorney, Agent, or Firm*—William D. Lanyi

[57] ABSTRACT

A current sensor is provided with a flux concentrator which is made of two or more annular laminae. The laminae, or lamina plate, each are provided with a gap formed in its circumferential length. Each lamina has a gap which is defined by two opposing faces. The laminae are stacked with their planar surfaces in contact and in such a way so as to define a central opening. The gaps of the laminae are arranged proximate each other. One lamina is rotated relative to another to change the width of the effective gap by misalign the faces of the one gap relative to another. The lamina is rotated during the manufacture of the current sensor while an output voltage signal is measured as a function of a current passing through an opening of the flux concentrator. The degree of rotation of the lamina is determined as a function of the output signal to achieve a preselected current-/voltage relationship. By achieving a consistent relationship between current sensors made in accordance with the present invention, interchangeability from one current sensor to another can be achieved in a low costs current sensor.

8 Claims, 7 Drawing Sheets

MECHANICALLY ADJUSTABLE CURRENT SENSOR AND METHOD FOR MAKING SAME

BACKGROUND OF THE INVENTION

1. Field of the Invention

The present invention relates generally to current sensors, and more particularly, to a current sensor which can be adjusted during manufacture to achieve a specific relationship between an electric current flowing through an opening of the current sensor and an output signal from the current sensor.

2. Description of the Prior Art

There are many devices known to those skilled in the art which can be used to measure the magnitude of an electric current. One particular device, commonly referred to as a current sensor, comprises a magnetically sensitive transducer associated with a magnetic flux concentrator. The current sensor has an opening that is shaped to permit an electrical conductor to be extended therethrough. When an electric current passes through the opening in the current sensor, it creates a magnetic field which is concentrated along a generally annular path by a magnetic flux concentrator. The flux concentrator is shaped to have a space formed in its circumferential length. The magnetically sensitive device, such as a Hall effect device, is disposed within the space. An output signal of the current sensor varies as a function of the flux density within the space which, in turn, varies as a function of the electric current flowing through the opening of the current sensor.

Although many different styles of current sensors are known to those skilled in the art, a typical current sensor comprises a magnetic flux concentrator which is made of a ferrite material. Some current sensors incorporate a linear output Hall effect transducer which is disposed within the space formed in the concentrator. In a device of this type, the output signal of the linear output Hall effect transducer provides a linear output voltage signal that tracks the waveform of the sensed current flowing through the opening of the current sensor. The output signal from the Hall effect transducer varies as a function of the current magnitude for either AC or DC currents. Current sensors of this type ar available in commercial quantities from MICRO SWITCH, A Division of Honeywell Inc. and are identified under numerous catalog listings in the CS Series.

As numerous different household appliances are provided with enhanced capabilities, the need for current sensors has significantly expanded. However, the widespread use of current sensors in appliances is restricted by cost considerations. Normally, inexpensive current sensors do not provide an output signal voltage that varies with a sufficiently consistent relationship to the measured current consistently from one current sensor to the next. Applications of current sensors in appliances require the ability to replace one inexpensive current sensor with another without having to recalibrate the current sensor to suit the appliance into which it is being installed. Current sensors which exhibit a consistent output voltage signal to measured current ratio which does not vary significantly from one current sensor to the next are typically too expensive for widespread use in appliances.

It would therefore be significantly beneficial if a low cost current sensor could be provided which was adjustable during manufacture to achieve a relatively precise relationship between its output voltage and the measured current so that the low cost current sensor could be replaced by another low cost current sensor without having to recalibrate the sensor for the particular application into which it is being installed. In order for appliances to be cost effective, all of the parts installed in the appliance must be interchangeable with other like parts made for the same purpose. The purpose of the present invention it to achieve an inexpensive current sensor which can be manufactured in such a way that each current sensor is interchangeable with any other current sensor of the sam type. This requires the ability to manufacture the current sensor in such a way that the relationship between the output voltage signal and the measured current is predictable an precise within a predetermined range of operation.

SUMMARY OF THE INVENTION

The present invention provides a current sensor which comprises a magnetically sensitive device disposed in a space formed in the circumferential length of a magnetic flux concentrator. In a preferred embodiment of the present invention, the magnetic flux concentrator comprises at least two annular laminae. A first annular lamina is provided with a first gap formed in its circumferential length. The first gap is defined by first and second opposing faces which are spaced apart by a first preselected distance. The first annular lamina has a first planar surface. A second annular lamina having a second gap formed in its circumferential length is also provided with a second gap that is defined by third and fourth opposing faces which are spaced apart by a second preselected distance. The second annular lamina is provided with a second planar surface. The first and second annular laminae are associated together with the first and second planar surfaces disposed in contact with each other to define a central opening shaped to permit an electrical conductor to extend through both laminae.

A magnetically sensitive device is disposed in a space which is defined by the first and second gaps of the first and second annular laminae. The magnetically sensitive device is disposed between the first and second opposing faces and also between the third and fourth opposing faces. The magnetically sensitive device, which is a Hall effect transducer in a preferred embodiment of the present invention, has an output signal which varies as a function of the magnetic flux density in the space defined by the first and second gaps. The flux density is a function of an electric current flowing through the central opening and through the conductor. The flux density is also a function of the size and shape of the space formed by the first and second gaps. The first and second annular laminae are disposed relative to each other to misalign first and third faces by a predetermined distance which is determined as a function of the relationship between the current flowing through the opening of the current sensor and the output signal provided by the magnetically sensitive device.

During the manufacture of the present invention, the first lamina can be rotated relative to the second lamina to misalign the first and third faces and the second and fourth faces. By changing the shape of the space defined by the first and second gaps, the present invention permits the output signal from the magnetically sensitive device to be adjusted to a particular relationship to the magnitude of electric current flowing through the opening of the current sensor. When this adjustment is made, the first and second lamina can then be rigidly attached to each other through the use of a bonding agent or by welding the first and second annular laminae together.

By permitting each current sensor to be adjusted during manufacture so that the relationship between the measured current and the output signal is within a predetermined range, the accuracy of the current sensor can be significantly improved. Therefore, the present invention provides a means for significantly increasing the accuracy of a low cost current sensor and therefore permitting its widespread use in household appliances.

BRIEF DESCRIPTION OF THE DRAWINGS

The present invention will be more fully understood from a reading of the Description of the Preferred Embodiment in conjunction with the drawing, in which.

DESCRIPTION OF THE PREFERRED EMBODIMENT

Throughout the Description of the Preferred Embodiment, like components and elements will be identified by like reference numerals.

Figure 1:
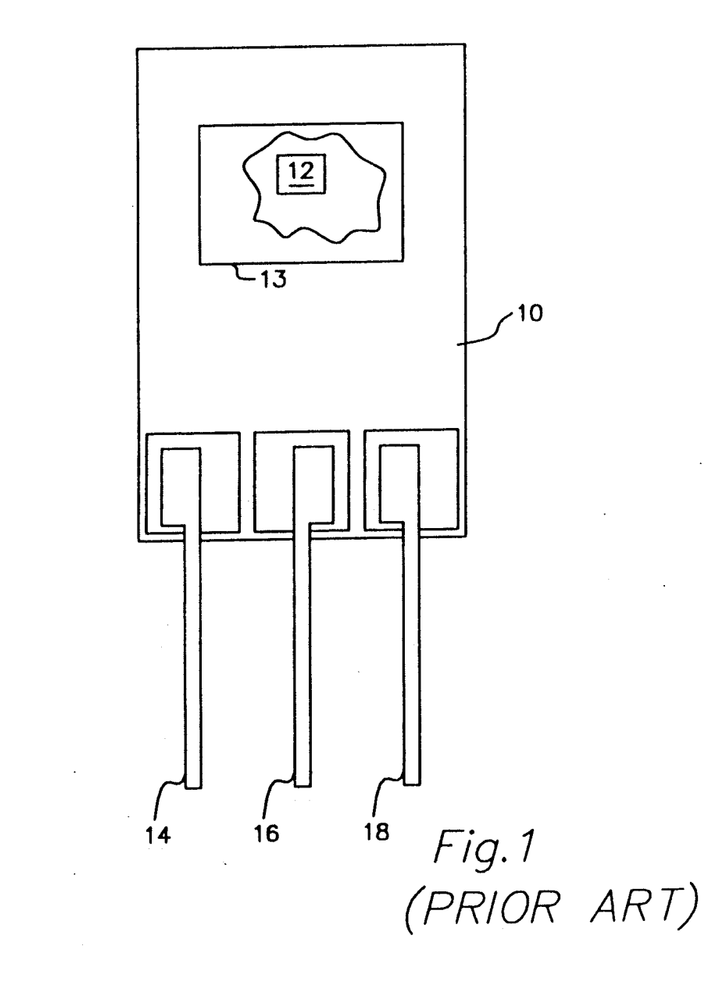
FIG. 1 shows a front view of a particular magnetically sensitive device.
Figure 2:
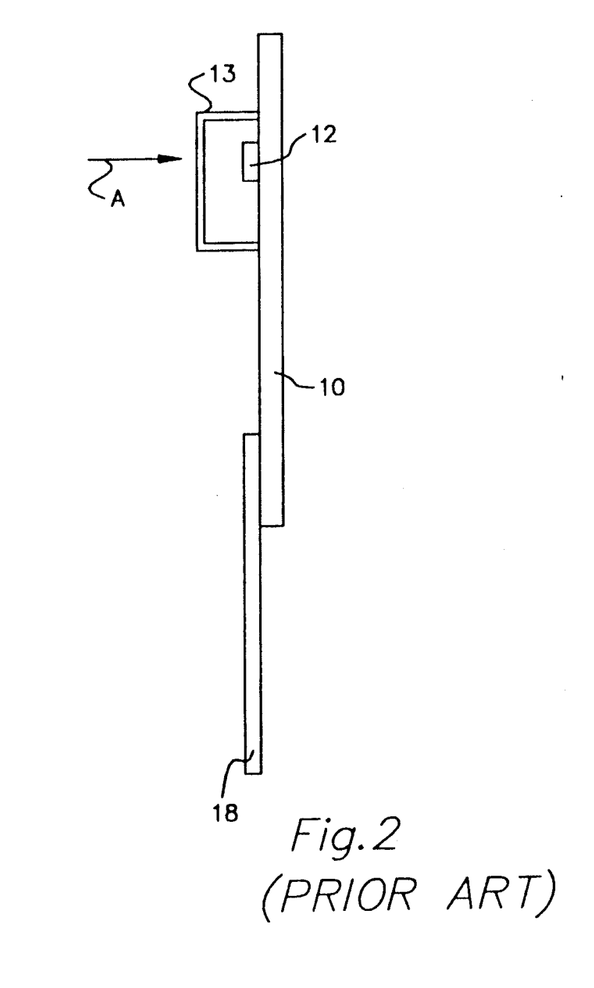
FIG. 2 shows a side view of the device illustrated in FIG. 1.

FIG. 1 shows a magnetically sensitive device which incorporates a linear output Hall effect transducer. Devices of this type are especially well suited for use in current sensors. The transducer shown in FIG. 1 comprises a ceramic substrate 10 on which an appropriate electrical circuit is contained. A Hall effect device 12 is contained under a protective cover 13. Three terminals, 14, 16 and 18 provide means for connecting the device to a source of positive voltage, a output signal receiver, and a point of ground potential, respectively. In the style of transducer shown in FIG. 1, the middle pin 16 provides an output voltage that is representative of the magnitude of magnetic flux passing in a direction perpendicular to the Hall effect device 12. FIG. 2 is a side view of the device shown in FIG. 1. The Hall effect device 12 is sensitive to a magnetic in the direction of arrow A, assuming the convention that the direction of the field of a magnet is from the north pole to the south pole. Devices of the type shown in FIGS. 1 and 2 are available in commercial quantities from MICRO SWITCH, a division of Honeywell Inc., and are identified as analog position sensors.

Figure 3:
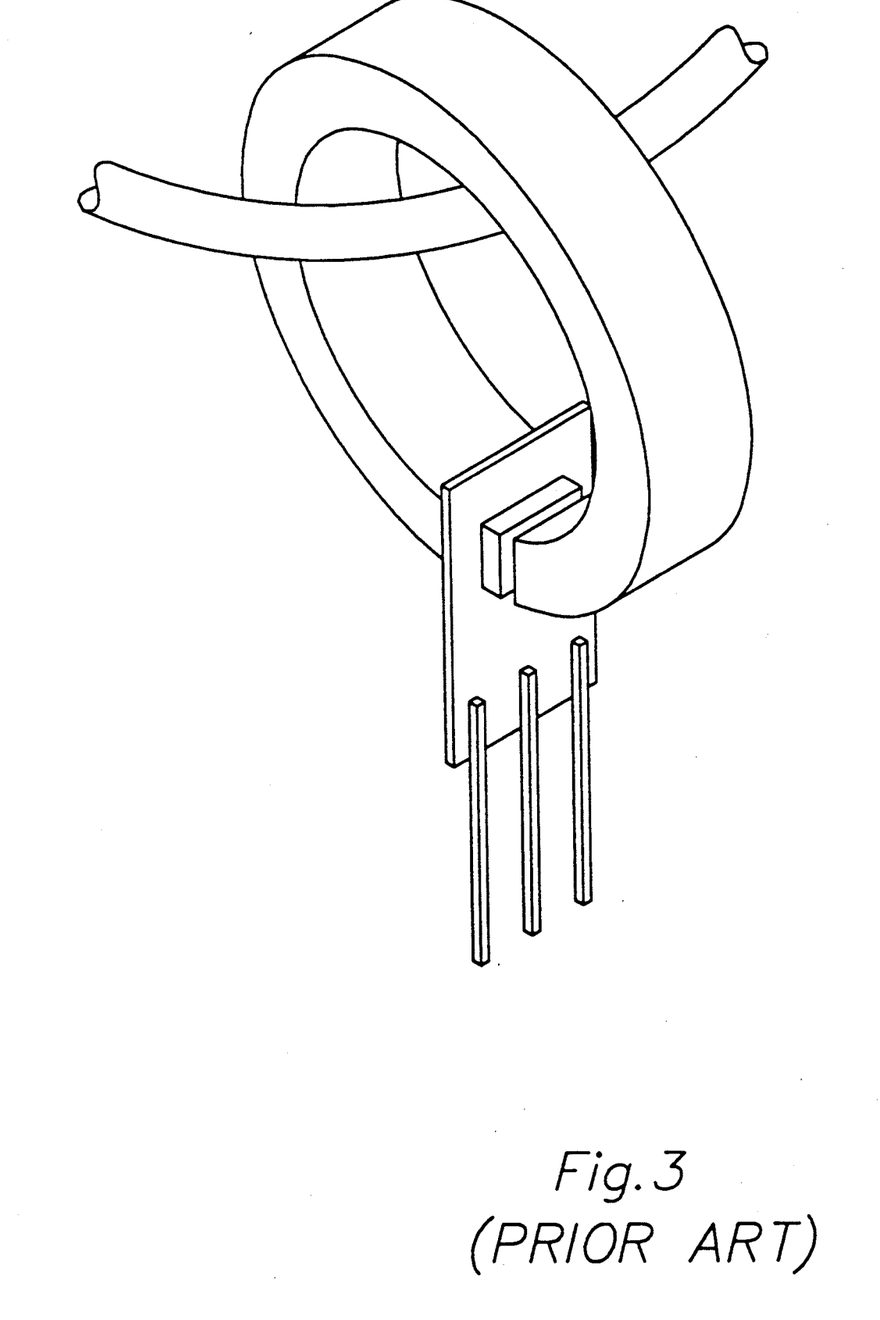
FIG. 3 shows the internal components of a current sensor known to those skilled in the art.

FIG. 3 shows the magnetically sensitive device of FIG. 1 combined with a magnetic flux concentrator 20.

The magnetic flux concentrator 20 is generally annular in shape and is provided with a gap in its circumferential length. The Hall effect transducer is disposed within the gap. The annular shape of the flux concentrator 20 provides an opening which permits an electric conductor 22 to be extended therethrough. As a result, the device shown in FIG. 3 will provide an output voltage on pin 16 when the appropriate voltage potential is provided between pins 14 and 18 and a current flows through the electric conductor 22. In operation, the electric current flowing through conductor 22 causes a magnetic field to exist around the conductor. The magnetic flux concentrator 20 concentrates the path of the flux within its structure and the flux extending across the gap affects the output of the Hall effect device which is disposed within the gap. The configuration shown in FIG. 3 therefore provides a device that has an output signal which varies as a linear function of the electric current passing through the conductor 22. Devices of the type shown in FIG. 3 are well known to those skilled in the art.

Figure 4:
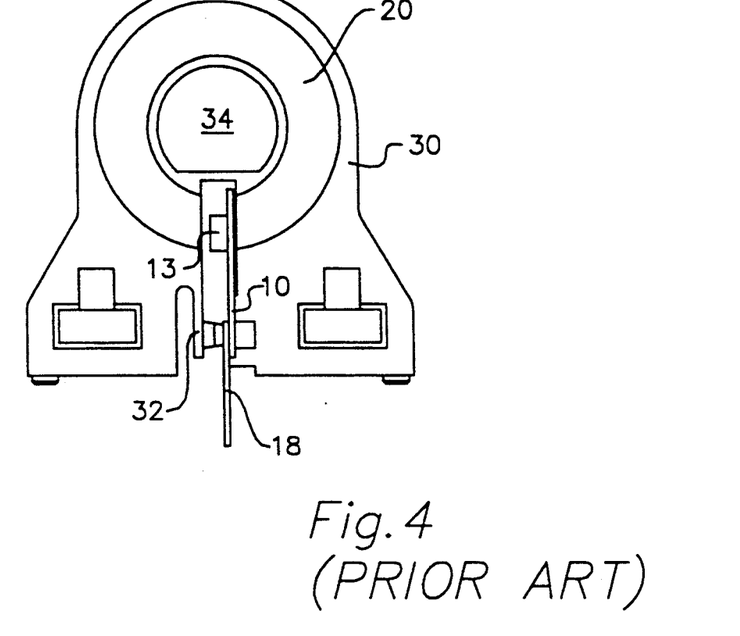
FIGS. 4 and 5 show front and rear views of a current sensor known to those skilled in the art.
Figure 5:
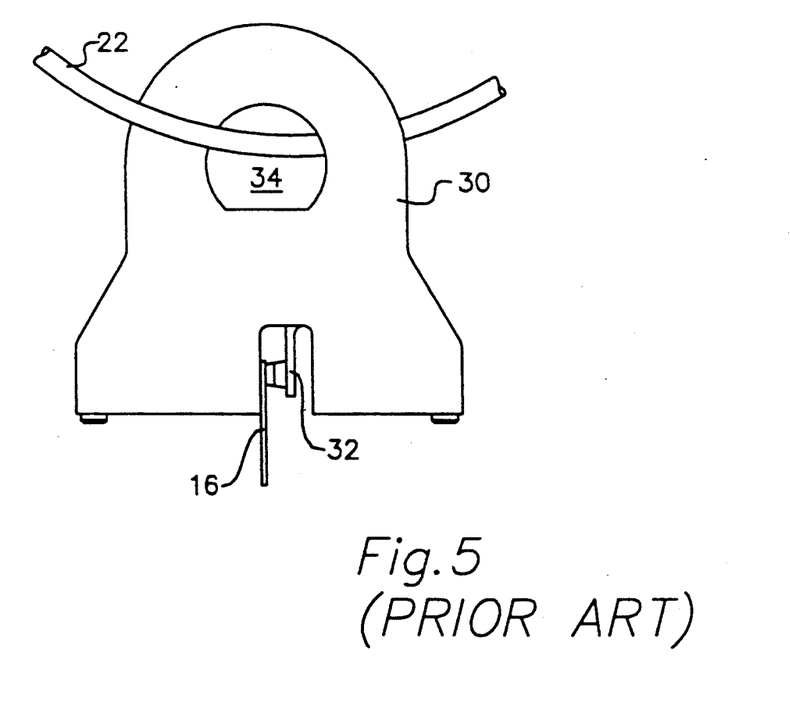

FIGS. 4 and 5 show front and back views of a current sensor which utilizes the general type of configuration shown in FIG. 3. A housing structure 30 contains the magnetic flux concentrator 20, the ceramic substrate 10 and the cover 13 of the Hall effect device. A means 32 is provided for retaining the device shown in FIGS. 1 and 2 at the proper position which disposes the Hall effect transducer within the space defined by the gap of the flux concentrator 20. Reference numeral 34 identifies an opening of the current sensor through which an electrical conductor can be extended to carry a current which is to be measured by the sensor.

Figure 6A:
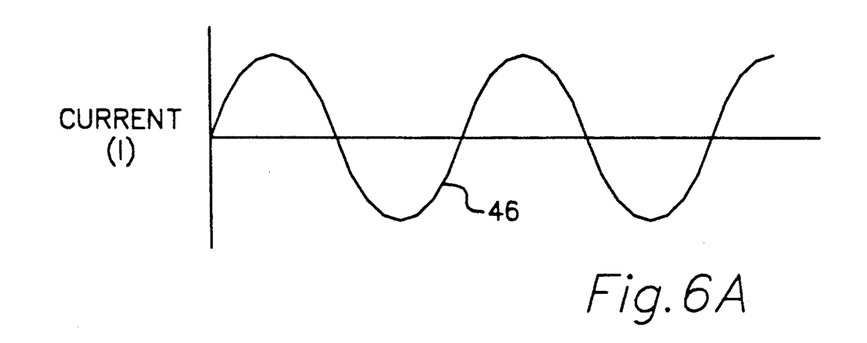
FIGS. 6A, 6B and 6C show the relationship between the current flowing through an opening of a current sensor, the flux density in the gap of the flux concentrator and the output signal voltage of a current sensor.
Figure 6B:
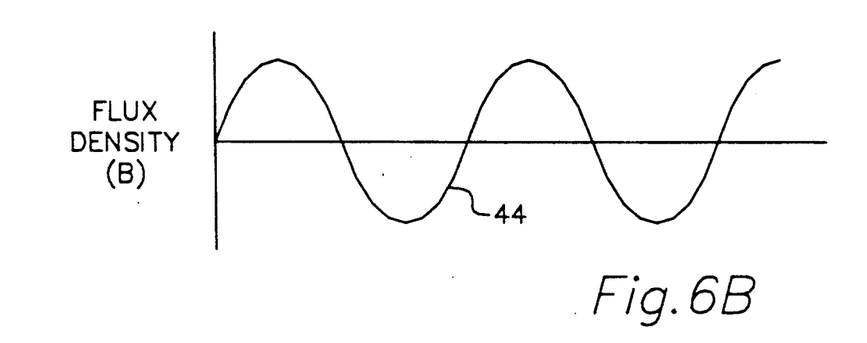
Figure 6C:
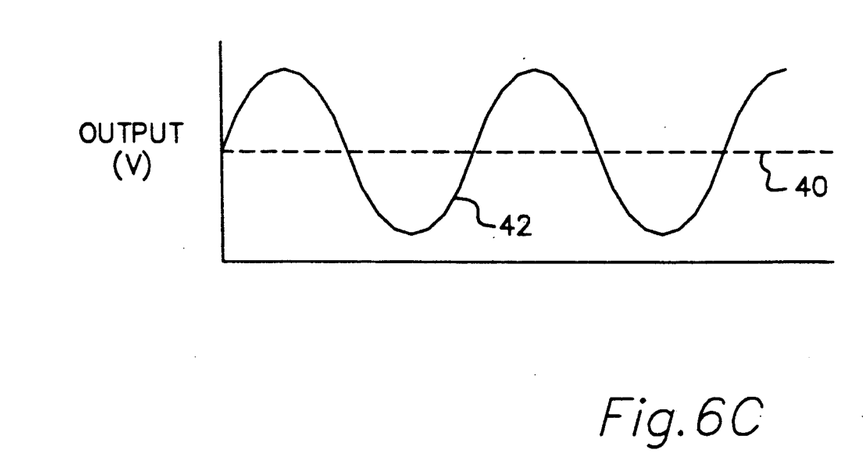

FIG. 6A shows a representation of an AC current waveform such as that which flows through electrical conductor 22. FIG. 6B shows the flux density in the concentrator gap which varies in accordance with the current flowing through the conductor 22. FIG. 6C shows a representative output voltage signal from the magnetically sensitive device in a particular configuration which provides an output signal approximately equal to half of the supply voltage of the transducer when a zero current magnitude passes through the opening 34 of the current sensor. For example, if the full range of the device is 5 volts, the offset represented by dashed line 40 would be equal to 2.5 volts. As can be seen in FIG. 6A, 6B and 6C, the output voltage signal 42 varies as a linear function of the flux density 44 in the gap of the flux concentrator. In addition, the flux density 44 varies as a function of the current 46 flowing through the conductor 22 which extends through the opening 34 of the current sensor.

Figure 7:
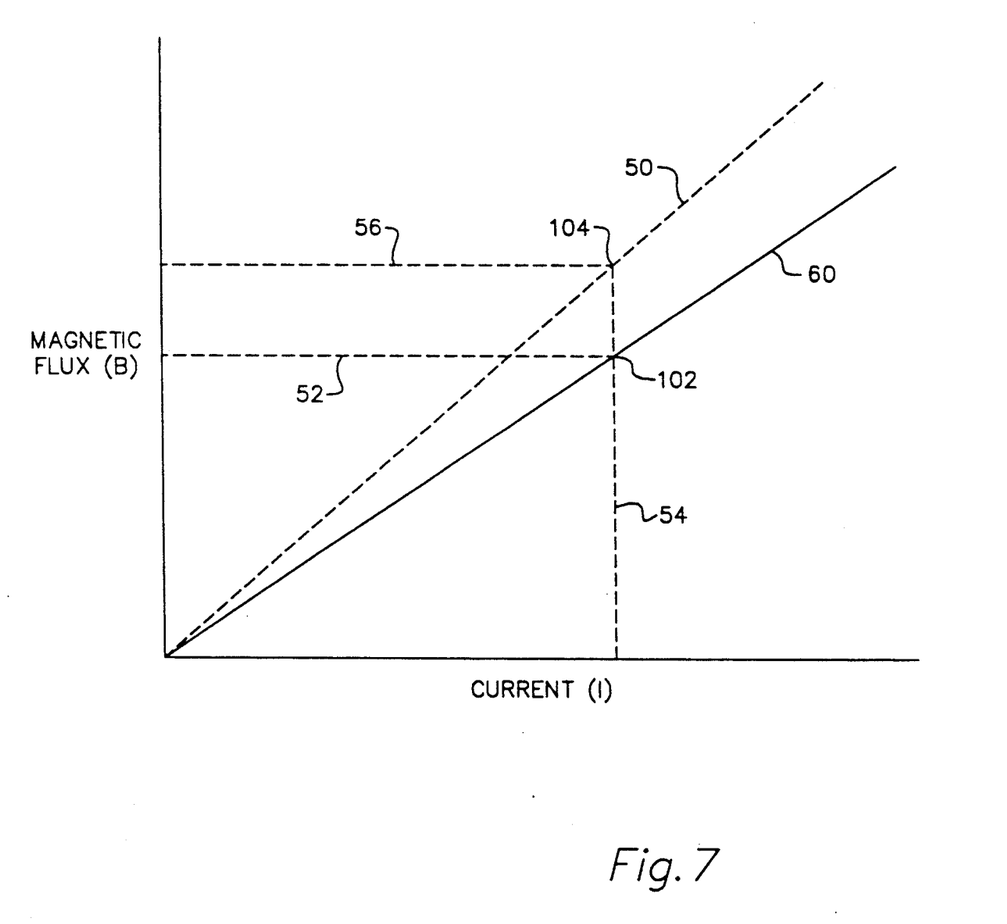
FIG. 7 shows the relationship between the magnetic flux and the gap of a flux concentrator and the current flowing through the opening of the flux concentrator.

FIG. 7 illustrates the relationship between the magnetic flux in the space defined by the gap of the flux concentrator 20 and the current flowing through the opening 34, in ampere-turns. If the current sensor is to be used in the many applications of the appliance industry which require the interchangeability characteristic described above, the output signal from the current signal must be virtually identical, as a function of the magnetic flux, in all similar sensors and should not vary appreciably from one current sensor to another. This level of consistency is difficult to achieve in low cost current sensors known to those skilled in the art. For example, if the relationship represented by dashed line 50 in FIG. 7 is required to permit the replaceability, or interchangeability, discussed above, a current sensor which provides a magnetic flux represented by dashed line 52 when a current represented by dashed line 54 flows through the conductor would not be acceptable. In order to permit the interchangeability of current sensors required for the appliance industry, a magnetic flux represented by dashed line 56 must be created in the spaced defined by the gap of the flux concentrator when a current defined by dashed line 54 flows through the conductor. If these circumstances do not exist, interchangeability will not be feasible. When a magnetic flux represented by dashed line 52 is created by a current identified by dashed line 54, it is apparent that the current sensor is operating under a relationship, between magnetic flux and current, which is defined by line 60 instead of the desired relationship represented by dashed line 50. If a means was provided for increasing the magnetic flux density within the space of the flux concentrator, interchangeability between current sensors could be achieved.

The present invention permits the relationship between flux density and current to be altered during manufacture. In other words, for a current represented by dashed line 54 in FIG. 7, the flux density measured at dashed line 52 could be altered to coincide with dashed line 56. This change is achieved during manufacture according to the present invention to effectively change the relationship between magnetic flux and electric current from that represented by line 60 to that represented by dashed line 50 in FIG. 7.

Figure 8:
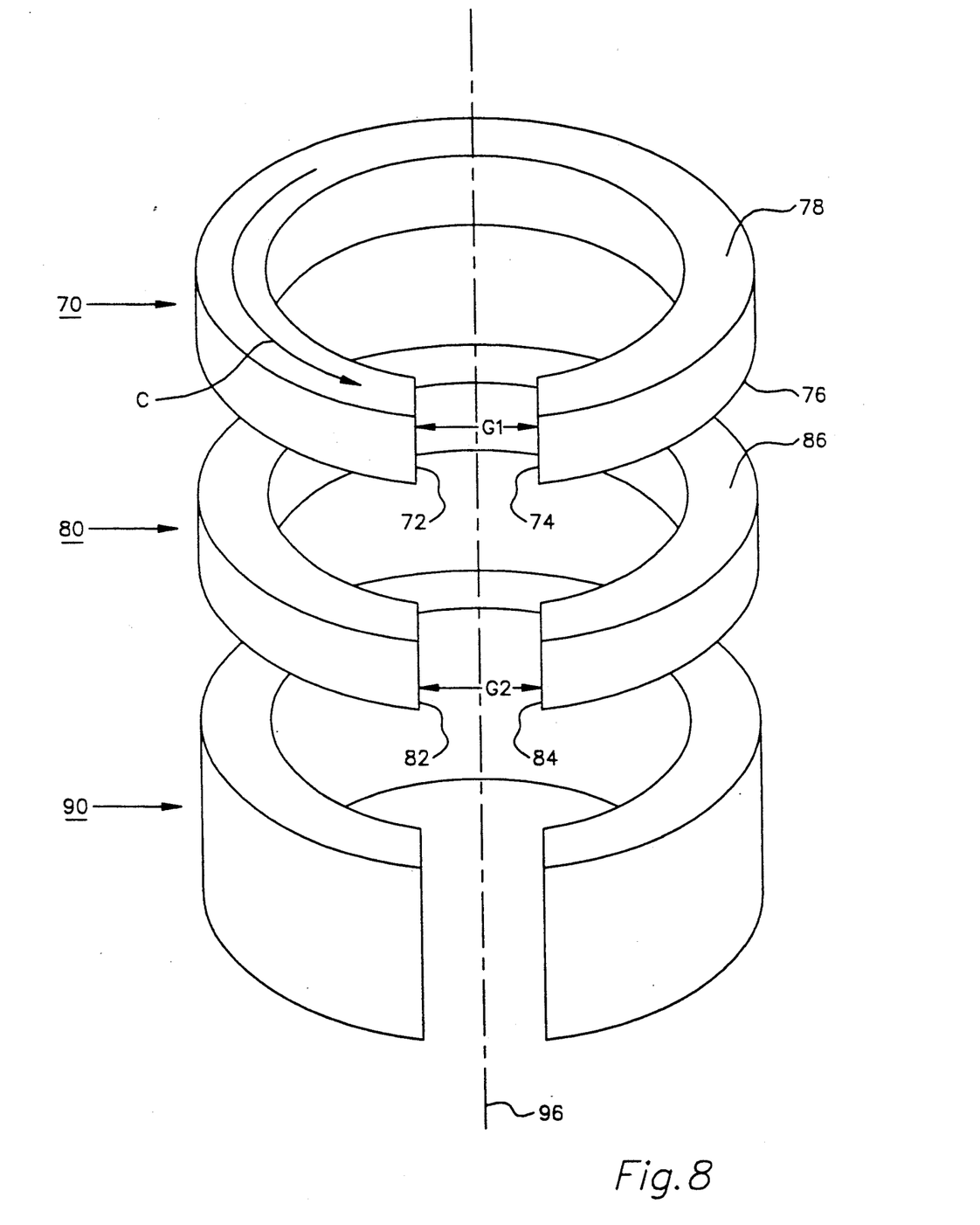
FIG. 8 shows an exploded view of the flux concentrator of the present invention associated with a spacer.

In FIG. 8, the flux concentrator of the present invention is illustrated. A first annular lamina 70 is provided with a first gap G1 which is defined by a first face 72 and a second face 74. The gap G1 is formed in the circumferential length of the first annular lamina. The first annular lamina 70 is provided with a first planar surface 76 which is generally similar to an opposite planar surface identified by reference numeral 78 in FIG. 8.

A second annular lamina 80 is provided with a second gap G2 which is defined by a third face 82 and a fourth face 84. The second gap G2 is formed in the circumferential length of the second annular lamina 80. The second annular lamina is provided with a planar surface 86. When the two laminae are combined to form a flux concentrator, the first planar surface 76 is disposed in contact with the second planar 86 and the first and second gaps, G1 and G2, are disposed proximate each other. A spacer 90 is provided in certain applications where the combined thickness of the first and second laminae is not sufficient to dispose the combined gap of the laminae at an appropriate position when they are disposed in a housing. The spacer 90 is made of a material, such as plastic, which does not interfere with the magnetic properties of the flux concentrator or the magnetically sensitive device described above.

With continued reference to FIG. 8, it can be seen that when the first annular lamina 70 is placed proximate the second annular lamina 80 with their respective planar surfaces, 76 and 86, in contact with each other, the first gap G1 and the second gap G2 combine to define a space having a width equal to the widths of the original gaps, G1 and G2, and a height which is equal to the sum of the thicknesses of the first and second laminae. It can also be seen that rotation of the first lamina about centerline 96 as shown by arrow C relative to the second lamina 80 will cause the first face 72 to move toward the right in FIG. 8. As the first face 72 moves in response to the rotation of the first lamina 70, the distance between the plane of the first face 72 and the plane of the fourth face 84 will decrease. This movement results in an effective reduction in the width of the space and creates a change in the flux density in the space where a magnetically sensitive device is disposed. The flux density in a gap of a flux concentrator is partially a function of the current flowing through the opening of the concentrator. It should be realized that the current flowing through the opening of a flux concentrator is a function of both the number of turns of conductor passing through the opening and the current flowing through that conductor. The flux density in the gap of a concentrator is also a function of the permeability of the concentrator, the length of the magnetic path through the concentrator and the dimension of the gap itself. In a circular concentrator like those shown in FIGS. 3 and 8, the length of the magnetic path is generally equal to a circumference drawn through the center of the flux concentrator's cross sectional area. This relationship is generally described a $$B=(0.4947NI\mu) \div ((Lm-Lg)+Lg\mu) \tag{1}$$

where I is the current flowing through the conductor, N is the number of turns of the conductor, $\mu$ is the permeability of the concentrator, Lm is the length of the magnetic path and Lg is the length of the gap. If the concentrator is made of a material which has a high permeability, this relationship can be reduced to $$B=0.4947NI \div Lg \tag{2}$$

In many applications of flux concentrators, a correction factor K for fringing, is added to the relationship of equation 2. This results in a relationship for the flux density in the gap of a flux concentrator expresses as $$B=(0.4947NIK) \div Lg \tag{3}$$

As can be seen in equation 3 above, the flux density in the gap of a flux concentrator can be changed by changing the effective gap Lg. The procedure described above changes the effective gap by rotating on of the annular laminae relative to the other to misalign the faces. Although the present invention is described in terms of generally circular laminae and in terms of the rotation of one lamina relative to the other, it should be understood that alternative embodiments of the present invention could use noncircular laminae and move one of the laminae linearly relative to the other rather than rotating one relative to the other. The important characteristic of the present invention is that it provides an inexpensive means for adjusting the effective gap Lg of a flux concentrator to achieve a level of repeatability from one current sensor to another without adversely increasing the cost of the sensor.

Figure 9:
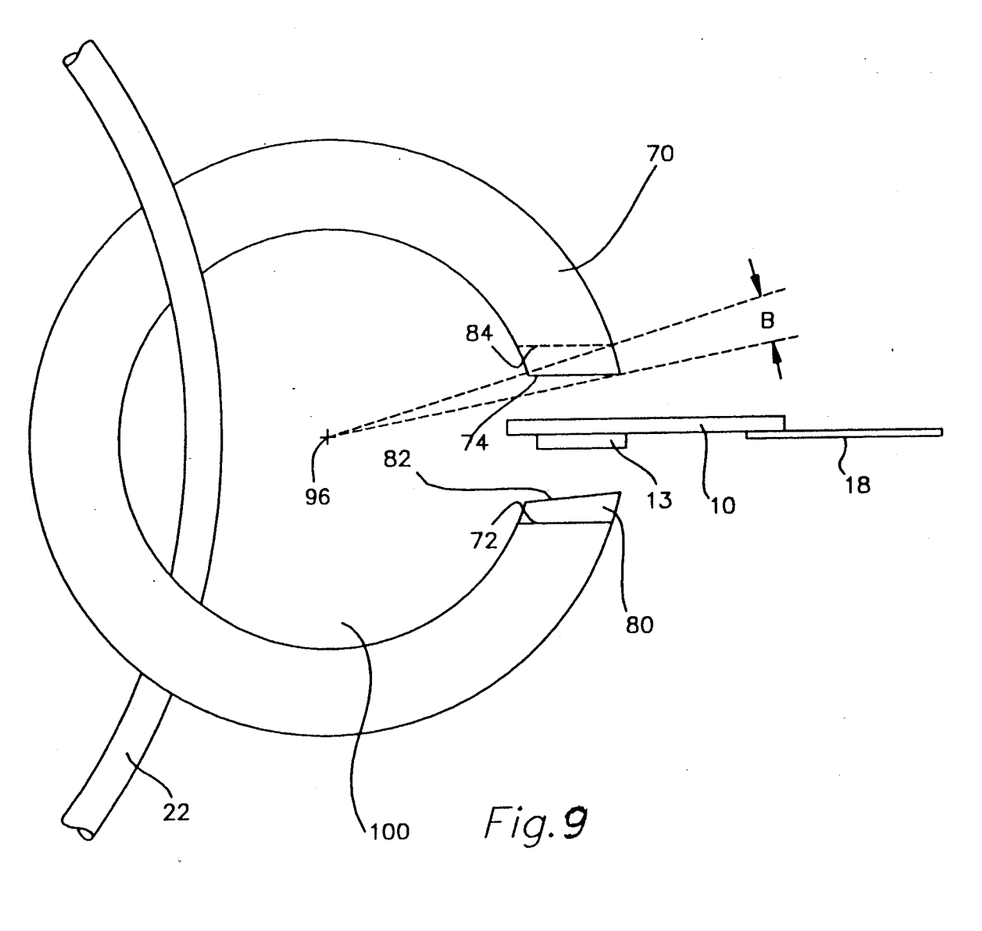
FIG. 9 shows the flux concentrator of the present invention associated with an electrical conductor and a magnetically sensitive component.

FIG. 9 shows a top view of a current sensor made in accordance with the present invention. It should be understood that the view of FIG. 9, for the purposes of clarity, does not show the housing structure 30 in which the components of FIG. 9 would normally be disposed. The first and second annular laminae, 70 and 80, are shown arranged in association with each other in such a way that their respective central openings combine to define an opening 100 through the combined structure. A conductor 22 extends through the combined opening 100. The first and second gaps of the first and second annular laminae are misaligned as a result of a rotation of the first annular lamina 70 with respect to the second annular lamina 80. As illustrated in the exemplary situation represented in FIG. 9, the first lamina has been rotated an amount which is generally equivalent to the angular movement identified as angle B. This movement misaligns faces 72 and 82 and also misaligns faces 74 and 84. It should be understood that, in the embodiment of the present invention illustrated in the figures, the gaps are defined by parallel opposing faces in each of the two annular laminae. As a result, the planes of the opposing faces do not extend through the centerline 96 of the laminae. In alternative embodiments of the present invention, the gaps could possibly be defined by nonparallel opposing faces which are radial in nature and disposed in planes that extend the central axes of the laminae.

With continued reference to FIG. 9, it can be seen that the ceramic substrate 10 is arranged in such a way that the cover 13 of the Hall effect device 12 is disposed within the space defined by the first and second gaps. The first and second laminae of the present invention are made of a permalloy material which comprises iron with a high nickel content. The flux concentrator shown in FIG. 3, which is very well known to those skilled in the art, is a ferrite component which is a magnetic material made of compressed powder. The annular laminae of the present invention can also be made of alternative materials other than permalloy. The important characteristics of the material is that it has a high permeability and a low residual magnetism.

Figure 10:
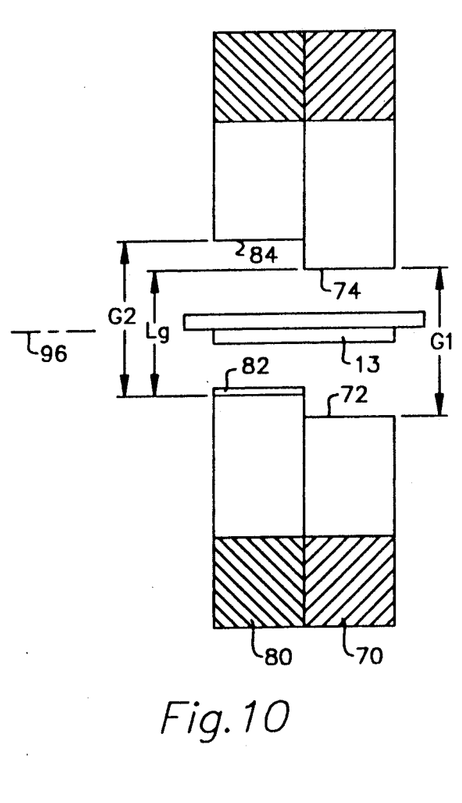
FIG. 10 shows a sectional view of the device illustrated in FIG. 9.

FIG. 10 shows a sectional view of the device illustrated in FIG. 9. The sectional view of FIG. 10 is specifically chosen to illustrate the effect on the gap of the combined flux concentrator when one of the laminae is rotated relative to the other. The widths of the first and second gaps, G1 and G2, remain unchanged as the first annular lamina 70 is rotated about the common centerline 96 relative to the second annular lamina 80. However, as can be in FIG. 10, the effective width of the overall gap is reduced as the plane of face 74 approaches the plane of face 82. This reduced width is shown in FIG. 10 and identified as the effective gap Lg. With reference to equation 3 above, it can be seen that a reduction in the effect of gap Lg will increase the magnitude of flux density B. With reference to FIGS. 7 and 10, it can be seen that a rotation of one lamina plate relative to the other lamina plate will increase the flux density in the space defined by the first and second gaps. For a particular current I, as represented by dashed line 54 in FIG. 7, the flux density can be increased from that identified by dashed line 52 at point 102 to the increased value identified by dashed line 56 at point 104. This has the effect of adjusting a current sensor from its normal flux/current relationship which is represented by line 60 to the desired flux/current relationship which is identified by dashed line 50. It should be understood that some current sensors will require significant reductions in the effective gap Lg while others will require only minor decreases in the gap to achieve the common flux/current characteristic identified by dashed line 50 which is necessary if the current sensors are to be considered interchangeable because of the similarity between the flux/current characteristics of all of the current sensors made according to the present invention.

During manufacture, the spacer 90, the first and second annular laminae, 70 and 80, and the magnetically sensitive device are arranged in a suitable housing such as that which is identified by reference numeral 30 in FIGS. 4 and 5. Prior to attaching the first and second annular laminae together and enclosing the components within a sealed housing, a preselected current is passed through a conductor extended in the opening 100 and the output signal voltage from the Hall effect transducer is measured. Since the output voltage from the Hall effect transducer in a preferred embodiment of the present invention is linear in relation to the flux density at the Hall effect device, the output voltage signal is linearly related to the current passing through the opening 100. Therefore, the output voltage signal can be measured and compared to a standard value that would provide interchangeability on the part of the current sensor. If the output voltage signal is too low, a first lamina can be moved relative to the second lamina to change the effective gap Lg and achieve the proper output voltage. After the appropriate output voltage signal is achieved, the first and second laminae are attached to each other to retain the proper relative position. This attachment can be achieved in several ways, such as by welding the two laminae together or, alternatively, by potting the spacer 90 and the two lamina plates within a housing structure. Many other attachment techniques are also possible.

The process of the present invention described above achieves a high degree of similarity in flux/current characteristics between one current sensor and the next. This, in turn, provides the interchangeability between current sensors that is necessary if the current sensors are to be suitable for use in a mass production industry, such as the home appliance industry, which requires a high degree of interchangeability at a low cost. The present invention provides both of these characteristics.

Although the present invention has been described in particular detail and illustrated with significant specificity, it should be understood that alternative embodiments of the present invention are within its scope. For example, although the annular laminae of the present invention are shown in a generally circular configuration, it should be understood that alternative lamina shapes are also possible. Rectangular flux concentrators can be used in a current sensor made in accordance with the present invention. In addition, although the present invention has been described as being made of a permalloy material, other materials are within the scope of the present invention as long as they exhibit a relatively high permeability and a relatively low residual magnetism.

The embodiments of the invention in which an exclusive property or right is claimed are defined as follows:

1. A current sensor, comprising:

a first lamina having a first gap formed in its circumferential length, said first gap being defined by first and second opposing faces which are spaced apart by a first preselected distance, said first lamina having a first planar surface;

a second lamina having a second gap formed in its circumferential length, said second gap being defined by third and fourth opposing faces which are spaced apart by a second preselected distance, said second lamina having a second planar surface, said first and second laminae being associated together with said first and second planar surfaces disposed in contact with each other, said first and second laminae defining a central opening shaped to permit an electrical conductor to extend therethrough; and a magnetically sensitive device disposed in a space defined by said first and second gaps, said magnetically sensitive device being disposed between said first and second opposing faces and between said third and fourth opposing faces, said magnetically sensitive device having an output signal which varies as a function of magnetic flux density in said space defined by said first and second gaps, said magnetic flux density being a function of an electric current flowing through said central opening in said conductor and the size of said space defined by said first and second gaps, said first lamina being disposed relative to said second lamina to misalign said first and third faces by a predetermined distance which is determined as a function of the relationship between said current and said output signal.

2. The sensor of claim 1, wherein said first and second laminae are generally circular in shape.

3. The sensor of claim 1, wherein said magnetically sensitive device is a Hall effect device.

4. The sensor of claim 1, wherein said first lamina is rotated relative to said second annular lamina to misalign said first and third faces and said second and fourth faces.

5. A current sensor, comprising:
a magnetic flux concentrator having a space formed in its length, said concentrator comprising first and second lamina plates, said concentrator having an opening shaped to permit an electrical conductor to extend through said concentrator; and
a magnetically sensitive device disposed with said space, said magnetically sensitive device having an output signal which varies as a function of magnetic flux density within said space, said magnetic flux density being a function of the magnitude of current flowing through said opening, said concentrator having a first gap of said first lamina plate proximate a second gap of said second lamina plate combined to form said space, said first lamina plate being positioned relative to said second lamina plate to achieve a preselected relationship between said output signal and said magnitude of current flowing through said opening, said first and second lamina plates rotated relative to each other to misalign said first and second gaps by an amount sufficient to achieve said preselected relationship and attached together in said rotated condition.

6. The current sensor of claim 5, wherein said first and second lamina plates are made of permalloy material.

7. The current sensor of claim 5, wherein said magnetically sensitive device is a Hall effect device.

8. The current sensor of claim 5, wherein said first and second lamina plates are generally annular in shape.

* * * * *